United States Patent
Possley

(10) Patent No.: US 6,300,798 B1
(45) Date of Patent: Oct. 9, 2001

(54) METHOD AND APPARATUS FOR CONTROLLING COMPENSATED BUFFERS

(75) Inventor: Brian Possley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/418,762

(22) Filed: Oct. 15, 1999

(51) Int. Cl.⁷ .............................................. H03K 19/0175
(52) U.S. Cl. ................. 326/83; 326/32; 326/31; 326/87
(58) Field of Search ................. 326/32–34, 82, 326/83, 87, 375, 325, 525

(56) References Cited

U.S. PATENT DOCUMENTS

| | | |
|---|---|---|
| 4,079,456 | 3/1978 | Lunsford et al. . |
| 4,975,598 * | 12/1990 | Borkar .................................. 326/86 |
| 5,303,191 * | 4/1994 | Eagan et al. ........................... 326/83 |
| 5,463,331 | 10/1995 | Kuo . |
| 5,640,122 * | 6/1997 | McClure .............................. 327/530 |
| 5,717,313 | 2/1998 | Grabon . |
| 5,869,983 * | 2/1999 | Ilkbahar et al. ....................... 326/83 |
| 5,870,001 | 2/1999 | Osterling et al. . |
| 5,883,801 | 3/1999 | Drucker et al. . |
| 5,898,321 | 4/1999 | Ilkbahar et al. . |
| 5,912,569 * | 6/1999 | Alleven ................................ 326/83 |
| 5,959,481 * | 9/1999 | Donnelly et al. ................... 327/170 |
| 6,031,385 | 2/2000 | Ilkbahar . |
| 6,092,030 * | 7/2000 | Lepejian et al. .................... 327/261 |

FOREIGN PATENT DOCUMENTS

| | | |
|---|---|---|
| 0606727A1 | 12/1993 | (EP) . |
| 0611053A2 | 1/1994 | (EP) . |
| 0718977A2 | 11/1995 | (EP) . |
| 63135882 | 6/1988 | (JP) . |
| 07022597 | 1/1995 | (JP) . |
| 11017516 | 1/1999 | (JP) . |

* cited by examiner

*Primary Examiner*—Michael Tokar
*Assistant Examiner*—Don Phu Le
(74) *Attorney, Agent, or Firm*—Kenneth M. Seddon

(57) ABSTRACT

In accordance with one embodiment of the invention, a system includes an integrated circuit that has a compensation value generator. The compensation value generator processes multiple compensation values to generate a compensation value that may be used by compensation circuitry.

24 Claims, 3 Drawing Sheets

METHOD AND APPARATUS FOR CONTROLLING COMPENSATED BUFFERS

BACKGROUND

As technology advances, the number of transistors within a die, the number of die fabricated on a semiconductor wafer, and the overall size of the semiconductor wafer all increase. Consequently, variations in the manufacturing process may result in transistors across a semiconductor wafer having varying operational performance characteristics. This may result in die within close proximity of each other on a semiconductor wafer to operate differently even though they were manufactured using substantially the same process.

In addition, the physical arrangement of transistors within a die as compared to the arrangement of other transistors may result in some of the transistors undergoing greater electro-mechanical stress during operation. This problem may be further acerbated by the operating conditions, such as temperature, for example, which may be imposed upon the device by a consumer. If the variation in performance becomes too extreme, the device may operate outside the range deemed acceptable by a customer. If this occurs, the device may not be sold and is usually scrapped for failing to meet operational conditions. Therefore, the overall cost of manufacturing semiconductor die is increased due at least in part to the loss of die that had to be scrapped due to their unacceptable performance.

This problem of performance variation may be addressed by adding additional circuitry to a die that modulates the performance of some of the transistors within the die. One such technique is described in U.S. Pat. No. 5,869,983 entitled "Method and Apparatus for Controlling Compensated Buffers", issued to Ilkabahar et al., on Feb. 9, 1999, which is assigned to the same assignee as the present invention. However, it may be desirable to provide a solution that has even greater flexibility.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
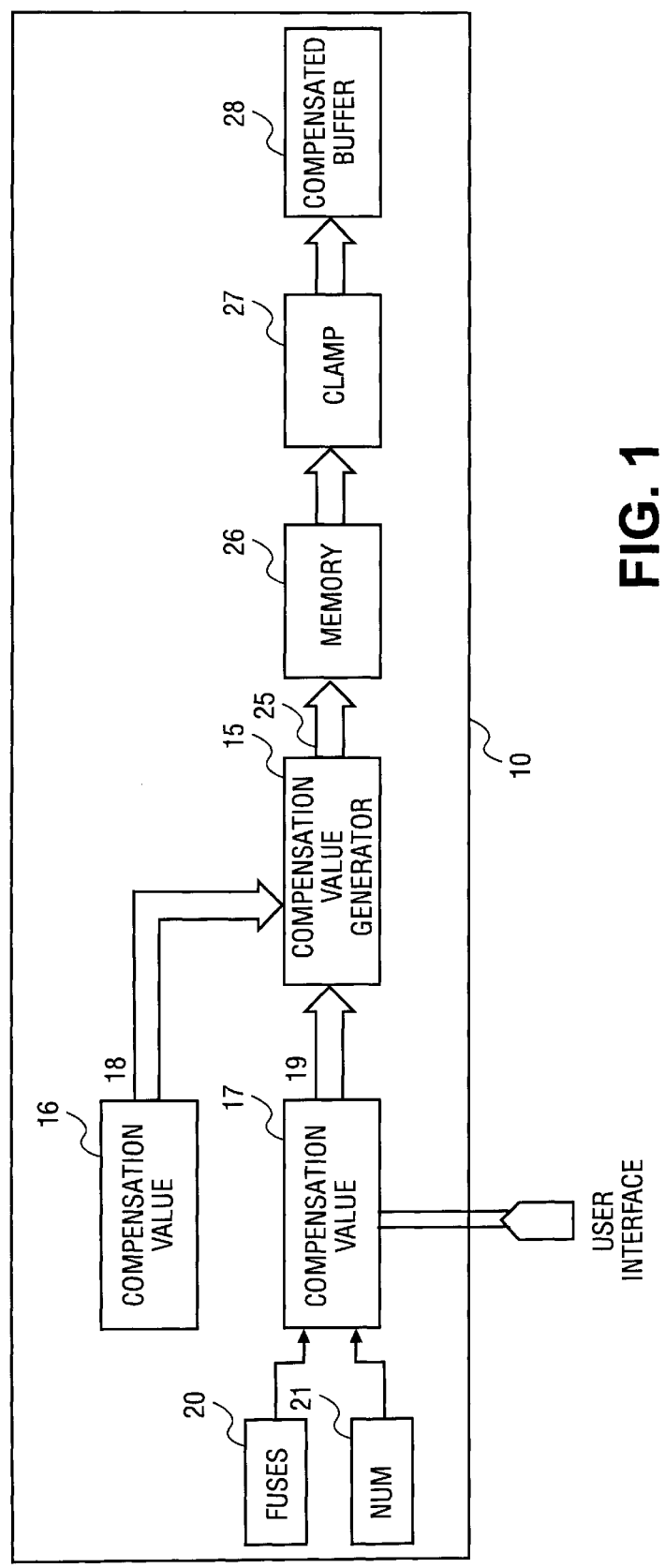
FIG. 1 is a block diagram representation of a portion of an integrated circuit having a compensation unit and a compensation value generator in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

FIG. 1 is a block diagram representation of a portion of an integrated circuit 10 in accordance with an embodiment of the invention. Embodiments of the present invention may include a variety of devices. Although the invention is not limited in scope in this respect, integrated circuit 10 may comprise a variety of semiconductor devices including, for example, a microprocessor, a microcontroller, a static random access memory (SRAM), a dynamic random access memory (DRAM), a non-volatile memory, or the like.

In this embodiment, integrated circuit 10 may include a compensation value generator 15. In this context, a compensation value generator comprises any device that receives as input signals two or more values and performs operations upon those received values to produce a value as an output signal that may perform mathematical algorithms (i.e., processes) with a variety of compensation values to provide integrated circuit 10 with an updated compensation value that may be used to adjust the performance of all or part of integrated circuit 10.

As explained in more detail herein below, compensation value generator 15 may include logic transistors or switches that process the compensation value provided by two different sources to calculate an updated compensation value. The compensation values processed by compensation value generator 15 may comprise digital values provided by sources external to compensation value generator 15 such as other circuitry, memory locations, a user interface, or the like. The updated compensation value may then used by other portions of integrated circuit 10 (e.g., compensation buffers) to adjust the performance of other transistors (not shown) within integrated circuit 10 by input/output (I/O) drivers or a compensated buffer, for example.

As shown in the example of FIG. 1, compensation value generator 15 processes compensation values 18 and 19 to be provided by memory locations 16 and 17, respectively. However, it should be understood that compensation value generator 15 may be modified so as to process a plurality of compensation values and that the present invention is not limited to adding just two values. In addition, neither of compensation values 18 and 19 need to be stored in a memory location as they may be provided dynamically as desired.

Figure 2:
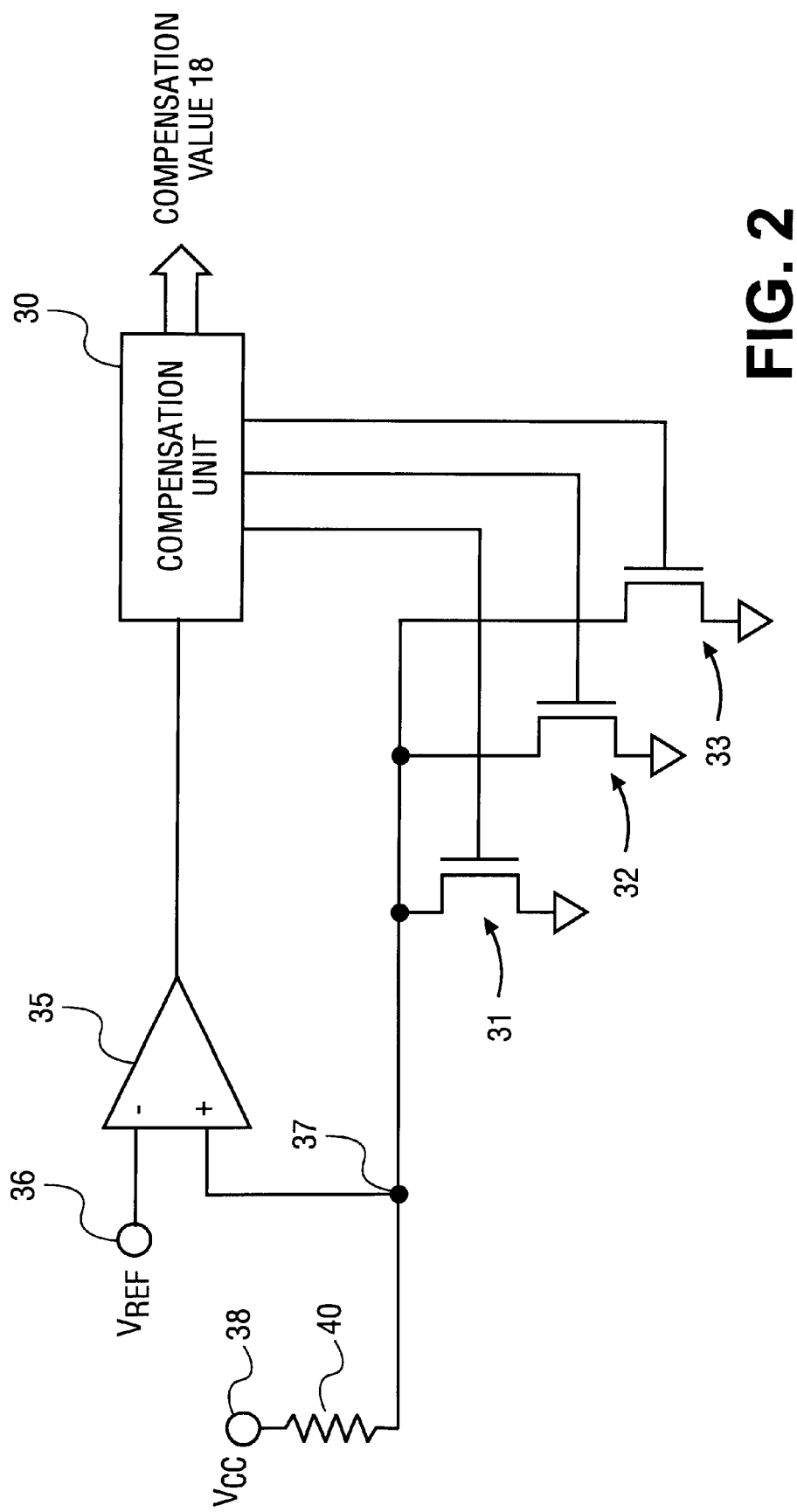
FIG. 2 is a schematic diagram representation of the embodiment of the compensation unit shown in FIG. 1.

Compensation value 18 represents a binary compensation value that is determined by other circuitry within or external to integrated circuit 10. An example of such circuitry is shown in FIG. 2. Although the invention is not limited in scope in this respect, FIG. 2 illustrates circuitry that may be used to determine compensation value 18. The circuitry includes a compensation unit 30 that is connected to a comparator 35 and transistors 31–33. It should be understood that the present invention is not limited to this particular configuration as another comparator device could be employed and the number of transistors connected to compensation unit 30 can be altered.

Simply stated, compensation unit 30 performs an analysis on a sub-set of the transistors within integrated circuit 10. This analysis results in generating a compensation value that is used by other portions of integrated circuit 10 to employ the appropriate compensation. Thus, the compensation value is a sequence of binary values that indicates the result of the analysis by the compensation unit.

In the embodiment illustrated in FIG. 2, comparator 35 compares a reference voltage ($V_{REF}$) at node 36 against the voltage provided at node 37. The voltage at node 37 is determined at least in part by the voltage provided at node 38 (e.g., power supply voltage, $V_{cc}$) and the voltage drop due to current flowing through resistor element 40. Logic circuitry within compensation unit 30 is used to enable/disable each of transistors 31–33 until the current flow through transistors 31–33 is sufficient so that the voltage at node 37 is approximately equal to the voltage at node 36. The state of each of transistors 31–33 (i.e., enabled or disabled) is determined by compensation unit 30 and represents all or part of compensation value 18 (see FIG. 1). Compensation value 18 may then be stored in a memory location 16 (e.g., cache, register, etc.) or be dynamically provided to adder 15 as desired.

Turning back to FIG. 1, compensation value generator 15 also processes a compensation value 19 stored in memory location 17. Again, this is not a requirement of this embodiment of the present invention as compensation value 19 may be dynamically provided to compensation value generator 15, for example. Compensation value 19 comprises an adjustable value that may be varied, for example, through software such as the basic input/output system (BIOS) that is used to control the operation of integrated circuit 10.

For example, when some integrated circuits such as microprocessors, microcontrollers, or the like are turned on, the integrated circuit may begin an initialization routine. The instructions for the initialization routine may be stored as BIOS instructions. The BIOS instructions may be used for a variety of reasons and may be used to pre-set values within the integrated circuit. In particular, the BIOS instructions may be used to initialize values stored in registers, flags, etc. Accordingly, in an alternative embodiment of the present invention, the BIOS instructions may be used to load memory location 17 with a compensation value. Therefore, the value loaded into memory location 17 may be pre-determined by the manufacturer of integrated circuit 10 so that an initial value is stored each time integrated circuit 10 is turned on. Furthermore, the initial value may be adjusted by a consumer who has the ability to modify the BIOS instructions.

Turning back to the embodiment illustrated in FIG. 1, compensation value 19 comprises an adjustable or programmable compensation value that is used to fine-tune the performance of integrated circuit 10. The magnitude or value of compensation value 19 may be determined at least in part by the actual value of compensation value 18, a predicted value for compensation value 18, or a value that represents the least amount of compensation desired for integrated circuit 10. However, it should be understood that the scope of this embodiment is not limited to these examples. Thus, compensation value 19 may be used to add to, reduce, or adjust the compensation value provided by compensation unit 30. This provides for the fine tuning of the compensation that is applied to the transistors in integrated circuit 10.

In addition, compensation value 19 may be a binary string determined by an integrated circuit manufacturer to improve the operation of integrated circuit 10 for applications having particular temperature, voltage, frequency, etc., ranges. A manufacturer may also adjust compensation value 19 to reduce the electro-mechanical stress of transistors within integrated circuit 10. Such tuning may be beneficial depending on a variety of factors such as the package used to encase integrated circuit 10 or the application of a particular customer, for example.

Figure 3:
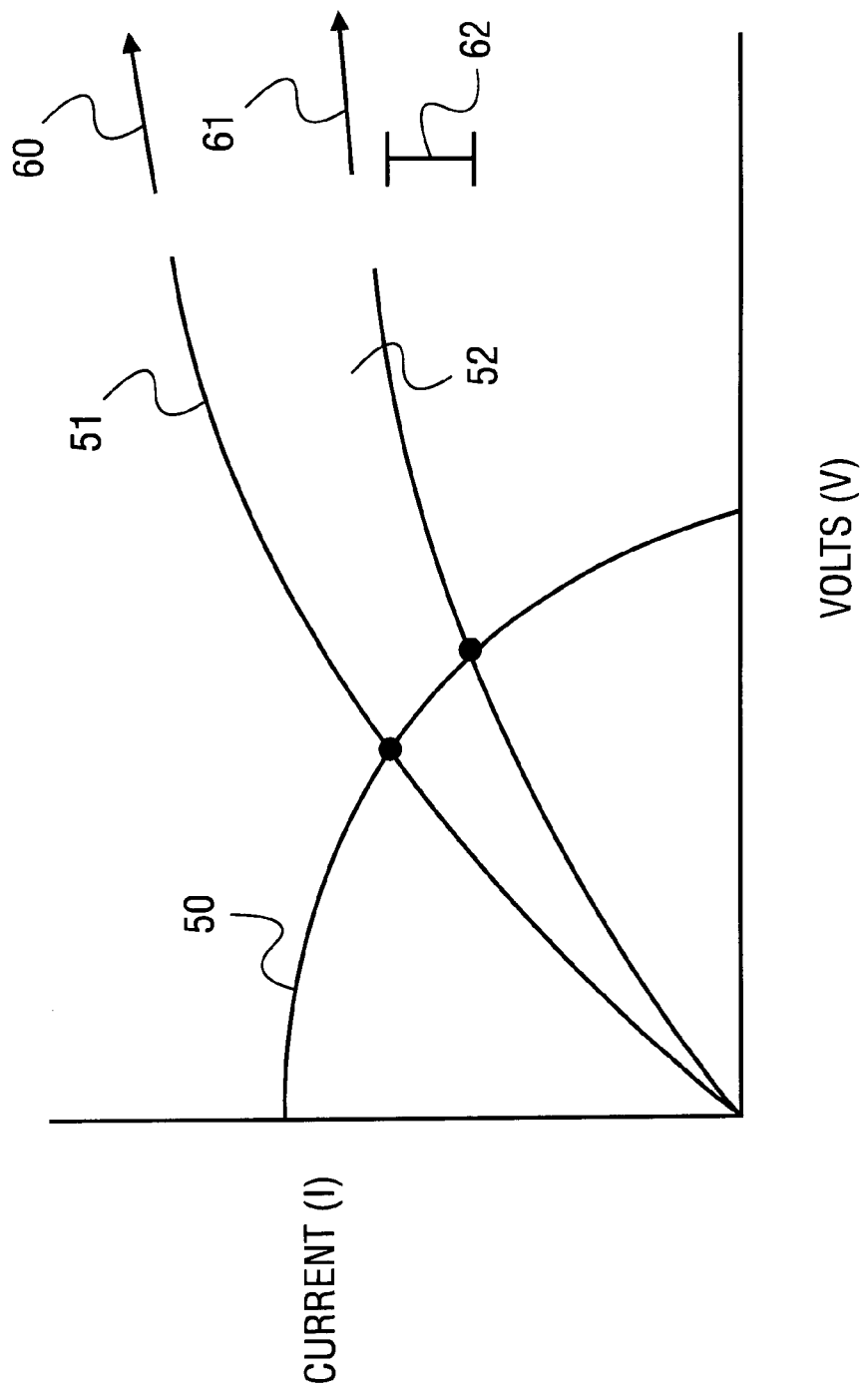
FIG. 3 is a graph illustrating the effect the embodiment of FIG. 1 may have upon the performance of some transistors in the integrated circuit.

FIG. 3 is provided to illustrate one example of how an embodiment of the present invention may be used to adjust the performance of an integrated circuit. In this example, integrated circuit 10 includes both p-channel metal-oxide semiconductor (PMOS) and n-channel metal-oxide semiconductor (NMOS) transistors, although the invention is not limited in scope in this respect. FIG. 3 is a graph of the current/voltage (I/V) characteristics of one PMOS device (line 50) against an NMOS device (line 51). As shown, the NMOS device is not as linear as the PMOS device. Consequently, the sourcing vs. sinking capability of transistors within integrated circuit 50 may not be ideal. Consequently, it may be desirable to adjust the slope of NMOS devices to improve the operation of integrated circuit 10.

More particularly, a compensation unit, such as the one shown in FIG. 2, may be used to adjust the performance of the NMOS devices. For example, a compensation unit may determine the amount of compensation desired and this compensation is then may be implemented with compensation circuitry (not shown). Thus, a compensation circuit may be used adjust the linearity of the NMOS devices as shown in FIG. 3 with lines 60 and 61 (the uncompensated performance indicated with line 60 and the compensated performance indicated with line 61). The magnitude of the effect of the compensation is indicated in FIG. 3 with a bracket 62. The compensation that is utilized to adjust the performance is represented as a binary, compensation value. Thus, an embodiment of the present invention may employ a comparison circuit that compares the operation of a PMOS transistor against the operation of an NMOS transistor to generate a compensation value. This adjusted or programmable compensation value is then added to the compensation value by compensation value generator 15 (see FIG. 1) to provide integrated circuit 10 with an updated compensation value.

In one embodiment, compensation value generator 15 performs binary, bit-by-bit addition of compensation value 18 and compensation value 19 to provide an updated calculated compensation value 25. Alternatively, it may be desirable for compensation value generator 15 to perform other processing such as only partial addition, multiplication, or to simply determine which of a set of values is larger. Consequently, compensation value generator 15 generates a final or calculated compensation value that is based at least in part on a plurality of compensation values that may be provided from different sources.

Once generated by compensation value generator 15, calculated compensation value 25 may be used by compensation circuitry, such as a compensated buffer 28, to adjust the operational performance of integrated circuit 10. For example, in one embodiment, compensated buffer 28 may decode calculated compensation value 25 and activate the appropriate circuitry to provide integrated circuit 10 with the desired compensation. As shown in FIG. 1, calculated compensation value 25 may be optionally stored in a memory location 26. However, this is not intended as a limitation of the present invention and it should be understood that compensation value 25 may be provided directly to compensated buffer 28. In another embodiment, selection circuitry (not shown) may be added to the circuit shown in FIG. 1 so that compensated buffer 28 receives compensation value 18, compensation value 19, or calculated compensation value 25. Furthermore, in yet another embodiment, an external read/write signal line may be added to allow an externally generated value to be written into memory location 26.

In one alternative embodiment, integrated circuit 10 may include a clamp 27 that is connected to the calculated compensation value 25 provided by compensation value generator 15 as shown in FIG. 1. However, it should be understood that clamp 27 may be omitted and the invention is not restricted in scope to require inclusion of a clamp. Here, clamp 27 is designed to have an acceptable clamp range and is used to determine if the value generated by compensation value generator 15 is outside this acceptable range. If calculated compensation value 25 is not within the acceptable range, then clamp 27 may intervene to provide compensated buffer 28 with an alternative compensation value. This feature may be desirable, for example, if compensation value 18 and/or compensation value 19 comprise a negative value, or if the processing performed by compensation value generator 15 results in a value that is an undesirable adjustment in the performance of integrated circuit 10. For example, clamp 27 may be used to ensure a selected minimal amount of compensation or to prevent excessive compensation within integrated circuit 10.

In yet another alternative embodiment, compensation value 19 may be provided by a series of fuses 20 or stored in a non-volatile memory (e.g., electrically erasable and programmable read-only memory (EEPROM), electrically programmable read-only memory (EPROM), Flash EEPROM, etc.) located within or external to integrated circuit 10. This embodiment allows integrated circuit 10 to have an initial compensation value as desired. For example, as the manufacturing conditions or target performance specifications of integrated circuit 10 vary, the appropriate compensation value may be pre-set to provide alternative values which in turn will improve the ability of the compensation unit to further adjust the performance of integrated circuit 10.

In addition, compensation value 19 may be provided to integrated circuit 10 through a user interface. A user interface may be, for example, a bus or register that allows a user to provide compensation value 19 from an external source. This may give either the manufacturer of an integrated circuit or a consumer the flexibility to adjust the amount of compensation applied within integrated circuit 10, for example.

By now it should be appreciated that this embodiment of the present invention provides a circuit for compensating the performance of an integrated circuit. This embodiment offers advantages not available with prior techniques, such as described in aforementioned U.S. Pat. No. 5,869,983 because this embodiment allows the compensation value provided by two or more sources to be combined as desired to provide for improved tuning of the performance of integrated circuits. Prior techniques only allowed for selecting one of two compensation values and did not provide for the processing of the two values to provide a third value that was based at least in part on the two input values. Thus, the embodiment illustrated in FIGS. 1–2 provides flexibility not previously available.

While certain features of the invention have been illustrated and described herein, many modifications, substitutions, changes, and equivalents will now occur to those skilled in the art. For example, adder 15 could be modified so as to allow for the processing of multiple input values. It is, therefore, to be understood that the appended claims are intended to cover all such modifications and changes as fall within the true spirit of the invention.

What is claimed is:

1. An integrated circuit comprising:
   a compensation unit capable of providing a first compensation value; and
   a compensation value generator capable of processing the first compensation value and a second compensation value to provide a third compensation value; the second compensation value determined externally to the integrated circuit.

2. The integrated circuit of claim 1, and further comprising at least one memory location capable of storing the second compensation value.

3. The integrated circuit of claim 1, and further comprising a compensated buffer that is capable of receiving at least one of the first compensation value, the second compensation value, and the third compensation value.

4. The integrated circuit of claim 1, and further comprising fuses coupled to provide a fourth compensation value, and wherein the compensation value generator is capable of processing the first compensation value, the second compensation value, and the fourth compensation value to provide the third compensation value.

5. The integrated circuit of claim 1, and further comprising fuses coupled to provide the second compensation value.

6. The integrated circuit of claim 1, and further comprising a non-volatile memory location coupled to provide the second compensation value.

7. The integrated circuit of claim 1, and further comprising at least one memory location that is capable of storing the third compensation value.

8. The integrated circuit of claim 1, wherein the third compensation value is a digital value and comprises the binary sum of the first compensation value and the second compensation value.

9. The integrated circuit of claim 1, and further comprising:
   a compensated buffer capable of receiving the third compensation value; and
   a clamp coupled to the compensated buffer, wherein the clamp has a clamp range, and wherein the clamp provides a clamped compensated value to the compensated buffer if the third compensation value is not with the clamp range.

10. A system comprising:
    a compensation unit to provide a first compensation value;
    at least one memory location, said at least one location to contain a second compensation value;
    a compensated buffer;
    a compensation value generator that combines the first compensation value and the second compensation value to provide the compensated buffer with an updated compensation value.

11. The system of claim 10 wherein the compensation value generator is capable of performing binary addition of at least a portion of the first compensation value and at least a portion of the second compensation value.

12. The system of claim 10, and further comprising:
    a plurality of p-channel metal-oxide semiconductor (PMOS) transistors;
    a plurality of n-channel metal-oxide semiconductor (NMOS) transistors;
    a comparison circuit that compares the operation of at least a portion of the PMOS transistors and the operation of at least a portion of the NMOS transistors, wherein the comparison circuit generates the second compensation value based on the comparison.

13. The system of claim 10, wherein the system is coupled to a user interface to provide the second compensation value.

14. An integrated circuit comprising:
    a compensated buffer;

means for generating a first compensation value;

means for storing the first compensation value;

means for generating a second compensation value;

means for processing the first compensation value and the second compensation value to provide the compensated buffer with a third compensated value.

15. The integrated circuit of claim 14 wherein the means for processing the first compensation value and the second compensation value includes a means for adding the first compensation value and the second compensation value.

16. The integrated circuit of claim 14, and further comprising means for storing the first compensation value, the second compensation value, and the third compensation value.

17. A circuit comprising:

a compensation unit having a plurality of transistors, wherein at least a portion of the plurality of transistors is capable of determining a first digital compensation value;

a memory location for storing a second digital compensation value; and a compensation value generator capable of combining at least a portion of the first digital compensation value with at least a portion of the second digital compensation value to provide a third digital compensation value.

18. The circuit of claim 17, and further comprising a clamp having a clamp range and a compensated buffer, wherein the clamp is capable of providing a compensated buffer with a fourth digital compensation value if the third digital compensation value is not within the clamp range.

19. The circuit of claim 17 wherein the compensation value generator is capable of performing binary addition of the first digital compensation value and the second digital compensation value to provide the third digital compensation value.

20. A method of compensating a circuit, comprising;

generating a first digital compensation value within an integrated circuit;

generating a second digital compensation value externally to the integrated circuit and;

processing the first digital compensation value and the second digital compensation value to generate a third compensation value.

21. The method of claim 20 wherein generating a second digital compensation value includes comparing the operation of a first plurality of transistors against the operation of a second plurality of transistors.

22. The method of claim 21 wherein the circuit includes an n-channel metal-oxide semiconductor (NMOS) transistor and a p-channel metal-oxide semiconductor (PMOS) transistor, and the method further includes comparing the operation of the NMOS transistor with the operation of the PMOS transistor.

23. The method of claim 20 wherein processing the first digital compensation value and the second digital compensation value includes adding at least a portion of the first digital compensation value to at least a portion of the second digital compensation value.

24. The method of claim 20 wherein the step of generating the second compensation value includes loading a compensation value in accordance with a BIOS instruction.

* * * * *